(12) United States Patent
Shim

(10) Patent No.: US 6,353,574 B1
(45) Date of Patent: Mar. 5, 2002

(54) SEMICONDUCTOR MEMORY DEVICE HAVING PIPE REGISTER OPERATING AT HIGH SPEED

(75) Inventor: Young-Bo Shim, Ichon-shi (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/606,240

(22) Filed: Jun. 28, 2000

(30) Foreign Application Priority Data

Jun. 28, 1999 (KR) ............................................ 99-24955

(51) Int. Cl.$^7$ ................................................ G11C 8/00
(52) U.S. Cl. ........................................ 365/233; 365/236
(58) Field of Search ............................ 365/230.05, 233, 365/236, 194

(56) References Cited

U.S. PATENT DOCUMENTS

| | | | |
|---|---|---|---|
| 5,384,745 A | 1/1995 | Konishi et al. | 365/230.03 |
| 5,404,338 A | 4/1995 | Murai et al. | 365/233 |
| 5,499,215 A | 3/1996 | Hatta | 365/230.03 |
| 5,521,880 A | 5/1996 | McClure | 365/233.5 |
| 5,572,467 A | 11/1996 | Ghassemi et al. | 365/189.02 |
| 5,594,704 A | 1/1997 | Konishi et al. | 365/233 |
| 5,657,292 A * | 8/1997 | McClure | 365/233 |
| 5,895,482 A * | 4/1999 | Toda | 365/233 |
| 5,946,266 A | 8/1999 | Iwamoto et al. | 365/233 |
| 6,028,810 A | 2/2000 | Ooishi | 365/230.03 |
| 6,105,123 A * | 8/2000 | Raje | 365/230.05 |
| 6,160,754 A * | 12/2000 | Suh | 365/233 |

FOREIGN PATENT DOCUMENTS

| | | | |
|---|---|---|---|
| JP | 6-76567 | 3/1994 | G11C/11/401 |
| JP | 6-203552 | 7/1994 | G11C/11/401 |
| JP | 10-188553 | 7/1998 | G11C/11/401 |
| JP | 11-53887 | 2/1999 | G11C/11/41 |

* cited by examiner

*Primary Examiner*—Trong Phan
(74) *Attorney, Agent, or Firm*—Jacobson Holman, PLLC

(57) ABSTRACT

A pipe register for use in a semiconductor memory device, wherein said semiconductor memory device includes global input/output (I/O) lines, complementary global I/O lines, and pipe registers, coupled to said global I/O lines and said complementary global I/O lines, for detecting the data loaded on said global I/O lines and complementary global I/O lines to store the data, includes: a data detecting unit, coupled to said global I/O lines and complementary global I/O lines, for detecting whether the data is loaded on said global I/O lines and complementary global I/O lines; a control signal generating unit for sensing edges of the data loaded on the global I/O line and the complementary global I/O line to generate a rising edge sensing signal and a falling edge sensing signal; and a plurality of storage units for storing the data loaded on said global I/O lines and said complementary global I/O lines in response to a reset signal, the falling edge sensing signal and the rising edge sensing signal and for outputting the data in response to the pipe counter signal outputted from said pipe counting unit.

17 Claims, 18 Drawing Sheets

FIG. 1

| FIG. 1A |
|---|
| FIG. 1B |
| FIG. 1C |
| FIG. 1D |

FIG. 3

| FIG. 3A |
| FIG. 3B |
| FIG. 3C |
| FIG. 3D |

FIG. 4

| FIG. 4A |
| --- |
| FIG. 4B |
| FIG. 4C |
| FIG. 4D |

SEMICONDUCTOR MEMORY DEVICE HAVING PIPE REGISTER OPERATING AT HIGH SPEED

FIELD OF THE INVENTION

The present invention relates to a semiconductor memory device; and, more particularly, to a synchronous semiconductor memory device having a pipe register, which stores and outputs data at a high speed by using a pipeline scheme.

DESCRIPTION OF THE PRIOR ARTS

In a read operation, a synchronous memory device temporarily stores data to a temporary storage unit and then outputs the data through a data output pin in synchronization with an external clock. That temporary storage unit is called a pipe register.

FIGS. 1 and 1A–1D are schematic diagrams showing a synchronous memory device having a conventional pipe register.

Referring to FIGS. 1 and 1A–1D the synchronous memory device includes a plurality of pipe registers, each of which is coupled to four pairs of global I/O lines and complementary global I/O lines. By combining signals of the four pairs, a common prefetch signal PFETCH[0:2] is generated. The pipe registers, coupled to eight global I/O lines and complementary global I/O lines are commonly controlled by the common prefetch signal PFETCH[0:2].

As shown in FIG. 1A, a prefetch signal generator 100 is coupled to four pairs of global I/O lines and complementary global I/O lines GIO<4>, GIOZ<4>, GIO<5>, GIOZ<5>, GIO<6>, GIOZ<6>, GIO<7>, GIOZ<7>.

A prefetch signal generator 110 is coupled to four pairs of global I/O lines and complementary global I/O lines GIO<12>, GIOZ<12>, GIO<13>, GIOZ<13>, GIO<14>, GIOZ<14>, GIO<15>, GIOZ<15>. Pipe registers 120 to 127 are respectively coupled to the global I/O lines and the complementary global I/O lines GIO<0>and GIOZ<0>, GIO<1>and GIOZ<1>, GIO<2>and GIOZ<2>, GIO<3>and GIOZ<3>, GIO<4>and GIOZ<4>, GIO<5>and GIOZ<5>, GIO<6>and GIOZ<6>, GIO<7>and GIOZ<7]>, and receives the common prefetch signal PFETCH[0:2] from the prefetch signal generator 100.

Pipe registers 128 to 135 are respectively coupled to four pairs of global I/O lines and complementary global I/O lines GIO<8>and GIOZ<8>, GIO<9>, GIOZ<9>, GIO<10>, GIOZ<10>, GIO<11>, GIOZ<11>, GIO<12>, GIOZ<12>, GIO<13>, GIOZ<13>, GIO<14>, GIOZ<14>, GIO<15>, GIOZ<15>, and receives the common prefetch signal PFETCH[0:2] from the prefetch signal generator 110.

Data output buffers 136 to 151 are coupled to output terminals of the pipe register 120 to 135, respectively.

A pipe counter 160 generates a pipe counter signal POCNT to the pipe registers 128 to 135. At this time, the data output is controlled by the pipe counter signal POCNT.

In such a synchronous memory device, the data on each of the global I/O lines and the complementary global I/O lines have different skews due to loads thereof. Therefore, a pulse width of the common prefetch signal PFETCH[0:2] should be widened as much as the skew between the global I/O line and the complementary global I/O line.

As a result, it is difficult for the conventional synchronous memory device to latch the data into the pipe registers in a high speed in case where the prefetch signal PFETCH[0:2] has a wide pulse width.

FIG. 2 is a circuit diagram showing a conventional pipe register. The conventional pipe register includes three storage units 200, 210 and 220.

As shown in FIG. 2, since the conventional pipe register clears data stored in storage unit 200 in response to a clear signal CL1, a cycle time is increased so that it is difficult to obtain a high speed of operation in the synchronous memory device.

SUMMARY OF THE INVENTION

It is, therefore, an object of the present invention to provide a synchronous memory device having a pipe register, which stores and outputs data at a high speed by using a pipeline scheme.

In accordance with an aspect of the present invention, there is provided a pipe register for use in a semiconductor memory device, wherein said semiconductor memory device includes global input/output (I/O) lines, complementary global I/O lines, and pipe registers, coupled to said global I/O lines and said complementary global I/O lines, for detecting the data loaded on said global I/O lines and complementary global I/O lines to store the data, said pipe register comprising: a data detecting means, coupled to said global I/O lines and complementary global I/O lines, for detecting whether the data is loaded on said global I/O lines and complementary global I/O lines; a control signal generating means for sensing edges of the data loaded on the global I/O line and the complementary global I/O line to generate a rising edge sensing signal and a falling edge sensing signal; and a plurality of storage means for storing the data loaded on said global I/O lines and said complementary global I/O lines in response to a reset signal, the falling edge sensing signal and the rising edge sensing signal and for outputting the data in response to the pipe counter signal outputted from said pipe counting means.

BRIEF DESCRIPTION OF THE DRAWINGS

Other objects and aspects of the invention will become apparent from the following description of the embodiments with reference to the accompanying drawings, in which:

FIGS. 1 and 1A–1D are schematic diagrams illustrating a synchronous memory device having a conventional pipe register;

FIGS. 3 and 3A–3D are block diagrams illustrating a synchronous memory device having a pipe register in accordance with an embodiment of the present invention;

FIGS. 4 and 4A–4D are circuit diagrams illustrating a pipe register shown in FIG. 3.

DETAILED DESCRIPTION OF THE PREFERRED EMBODIMENTS

FIGS. 3 and 3A–3D are block diagrams of a synchronous memory device having a pipe register in accordance with the present invention.

As shown in FIGS. 3 and 3A–3D, the synchronous memory device according to the present invention includes pipe registers which are directly coupled to a global I/O line and a complementary global I/O line without using an additional prefetch signal generator.

That is, the pipe register 300 is directly coupled to a global I/O line GIO<0>and a complementary global I/O line GIOZ<0>and the pipe register 301 is directly coupled to a global I/O line GIO<1>and the complementary global I/O line GIOZ<1>. In the same manner, the other pipe registers 302 to 315 are coupled to corresponding global I/O lines and complementary global I/O lines, respectively.

Figure 1A:
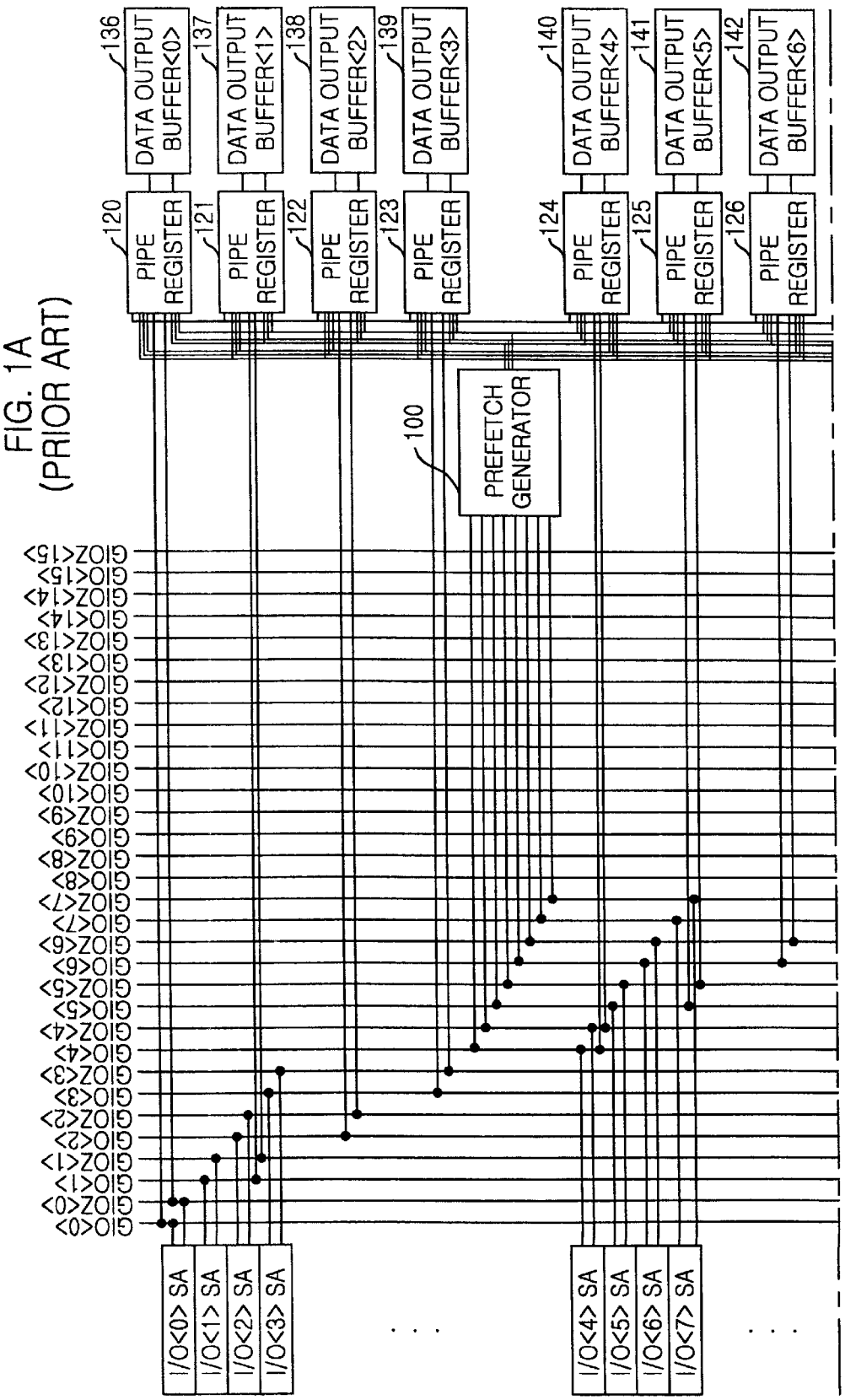
Figure 1B:
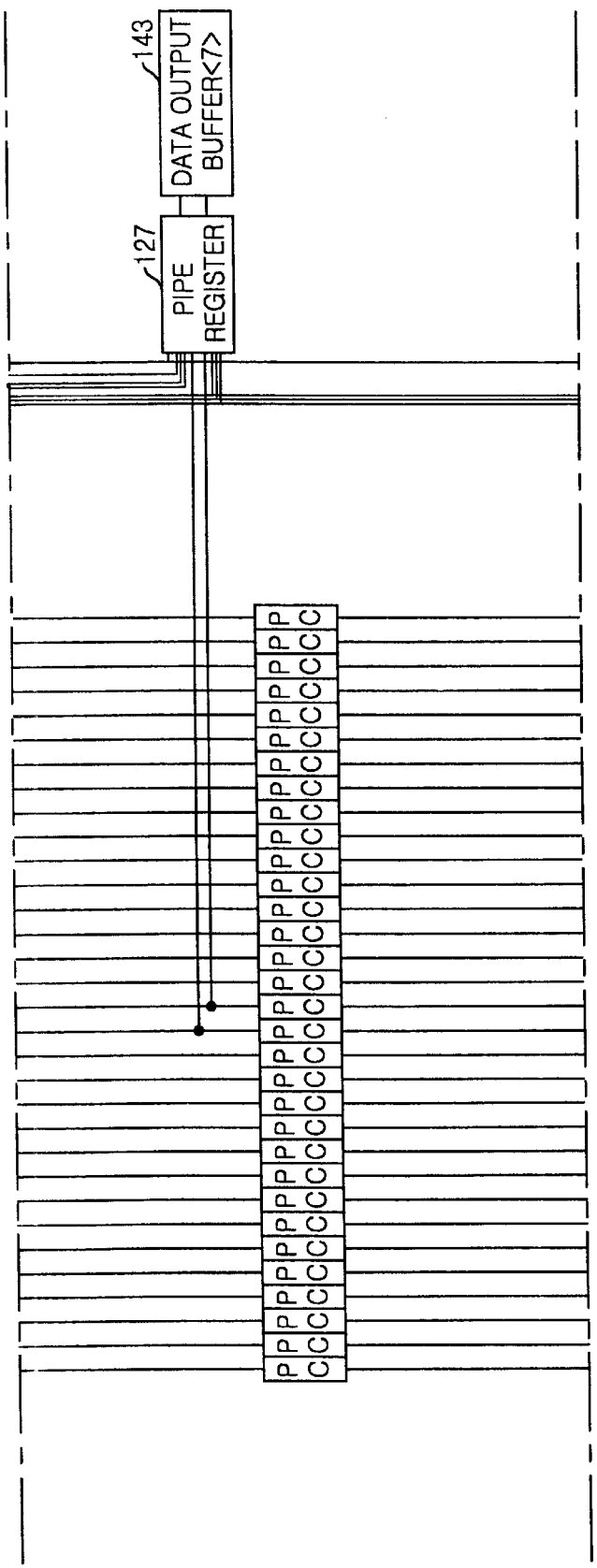
Figure 1C:
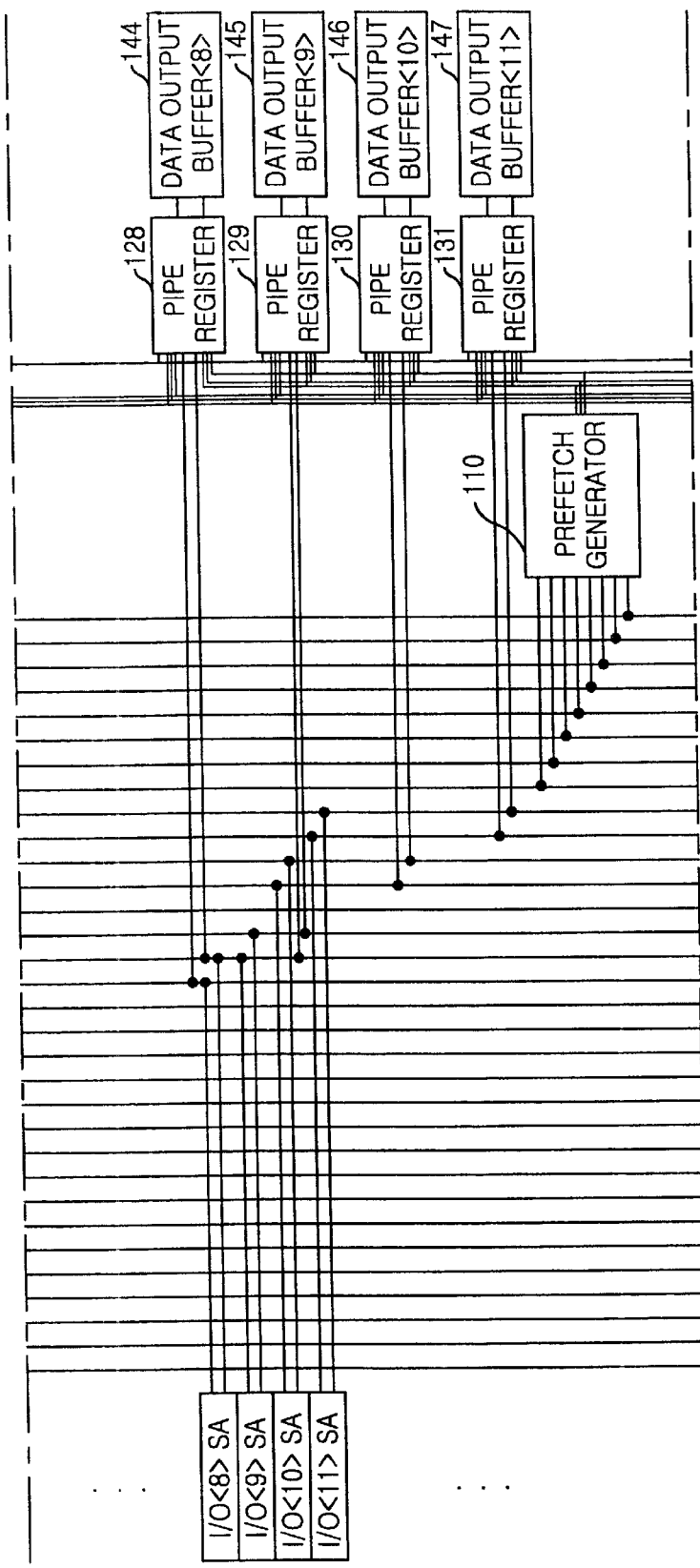
Figure 1D:
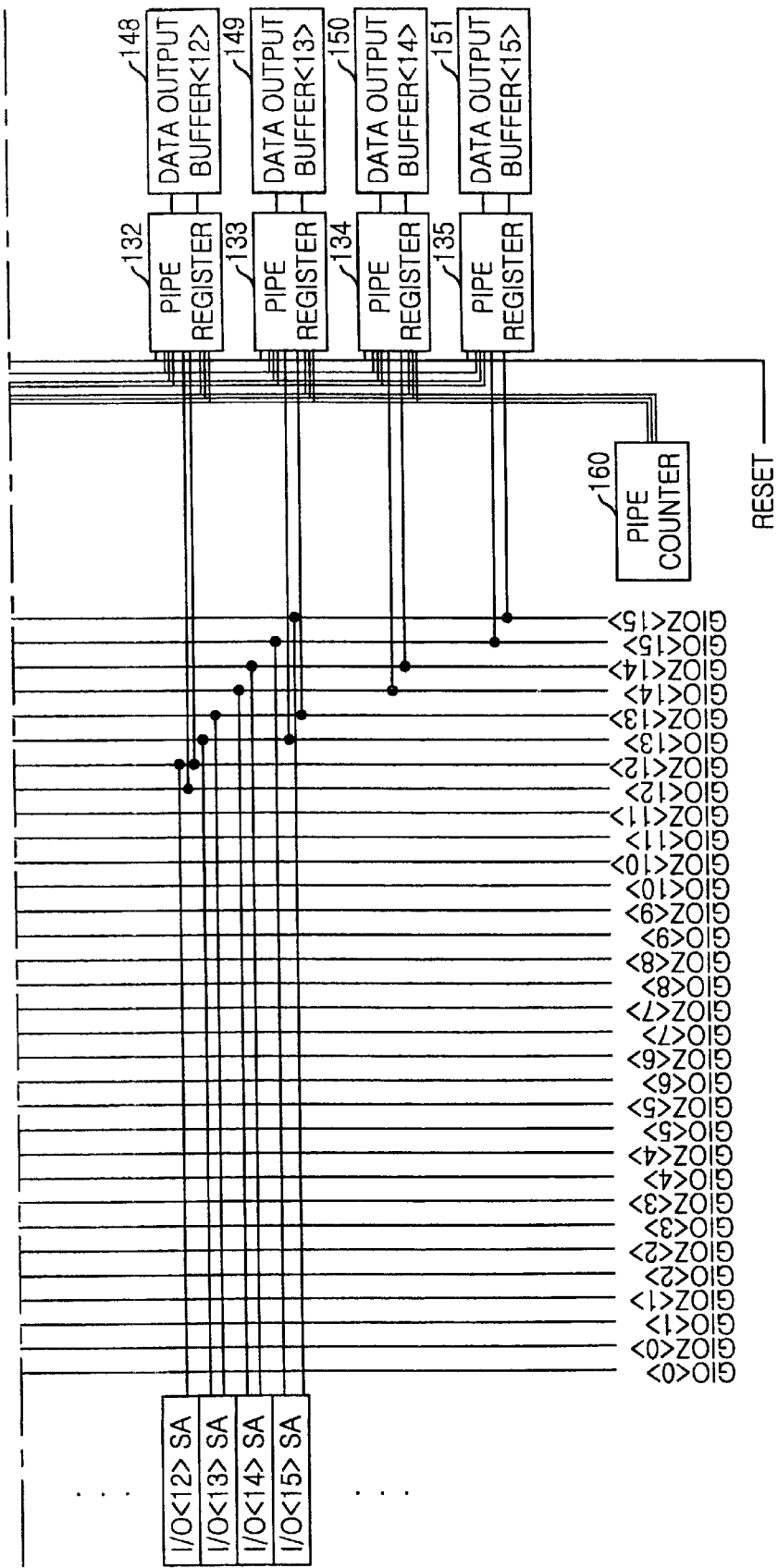
Figure 2:
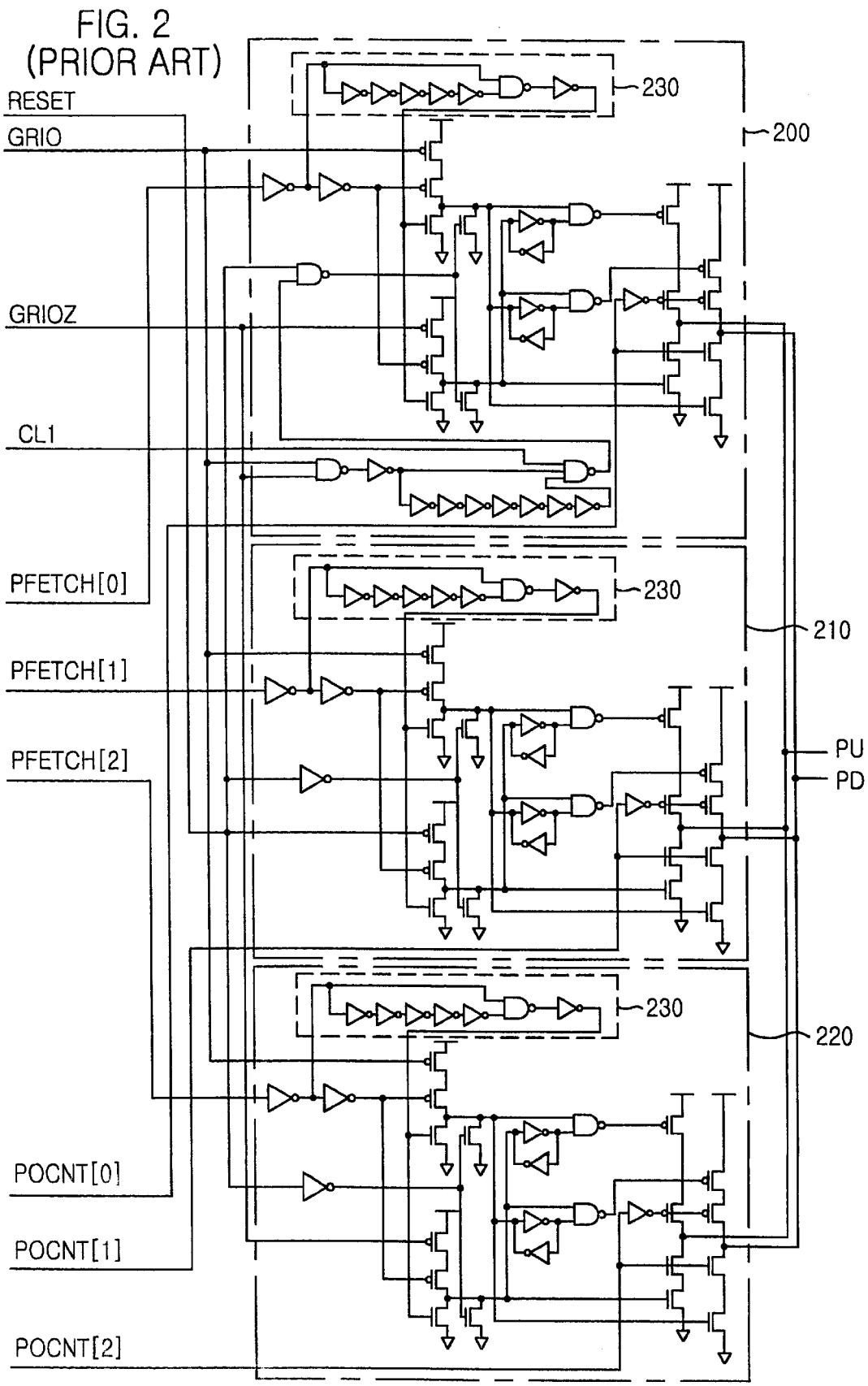
FIG. 2 is a circuit diagram illustrating a conventional pipe register.
Figure 3A:
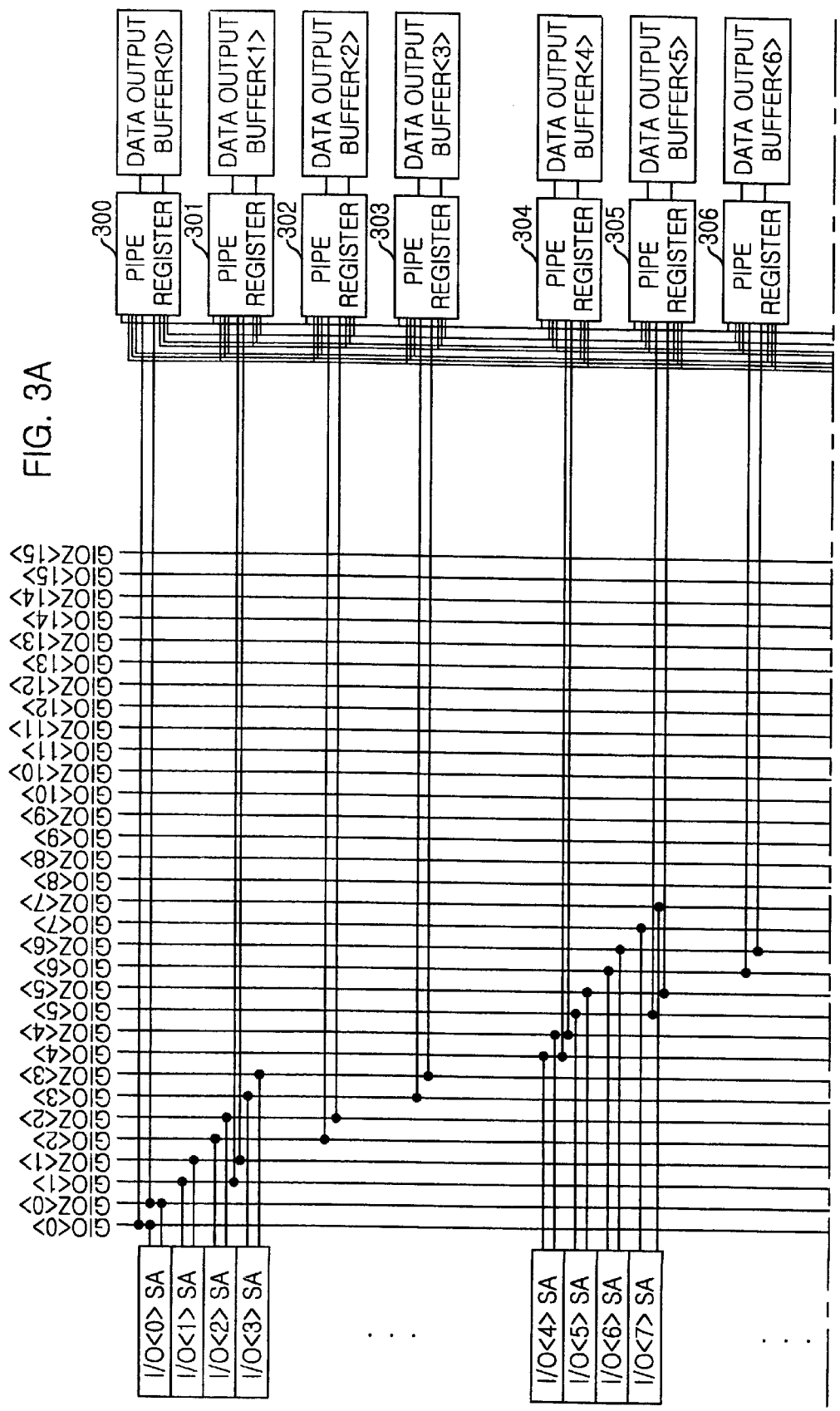
Figure 3B:
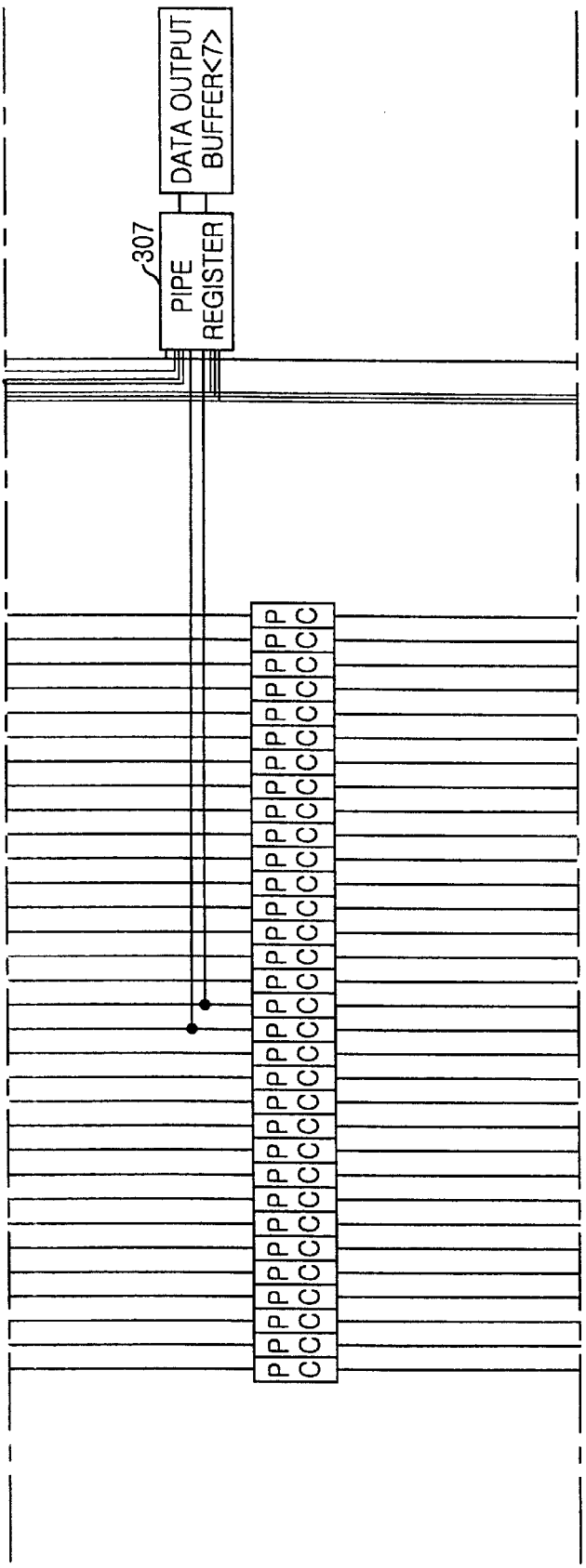
Figure 3C:
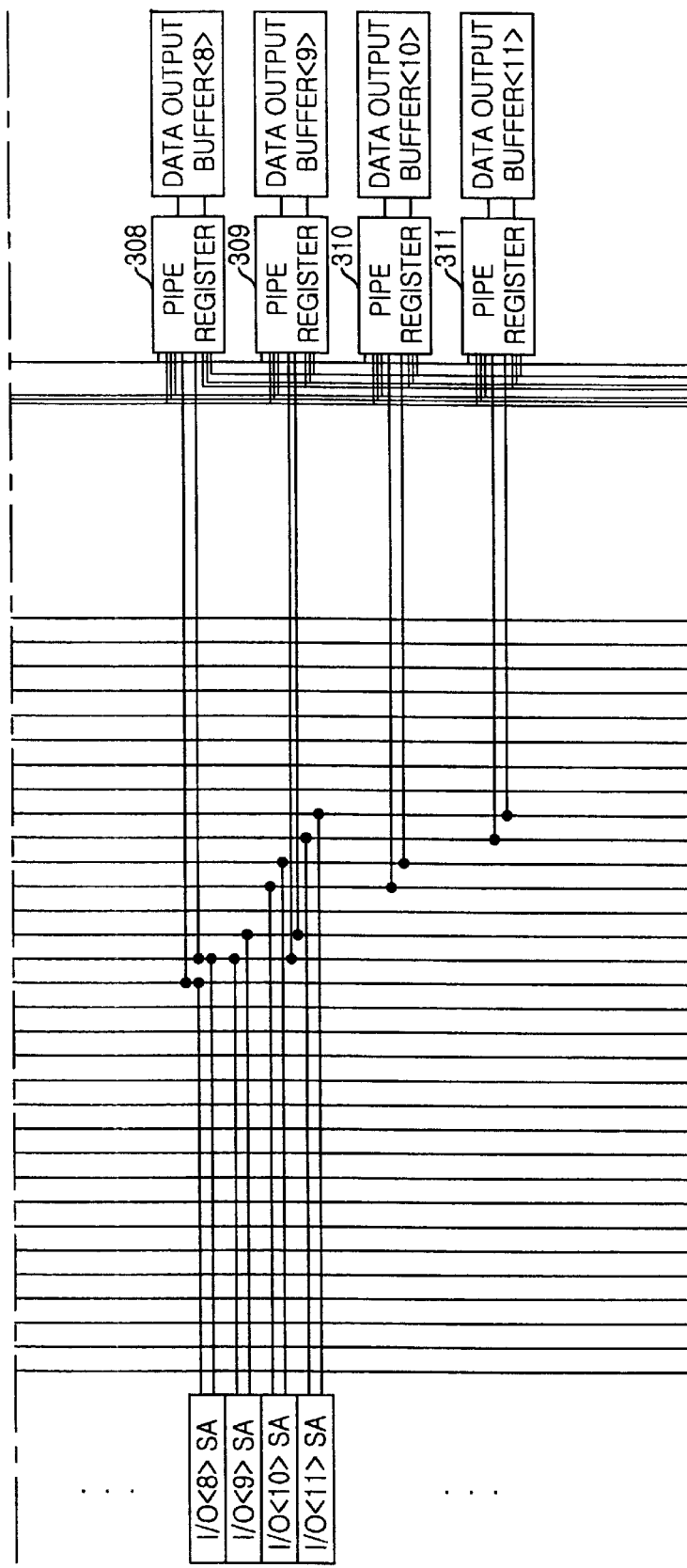
Figure 3D:
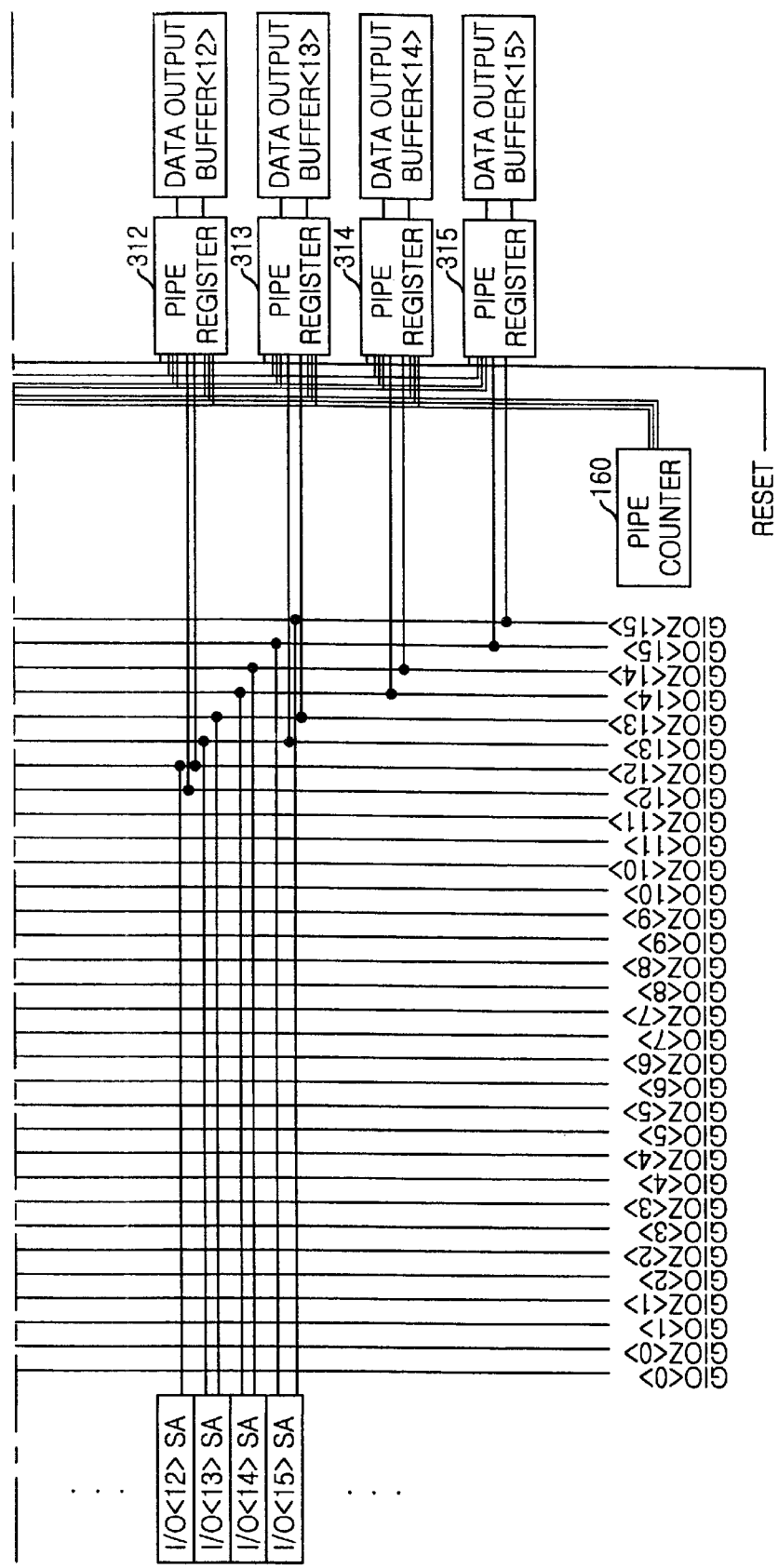
Figure 4A:
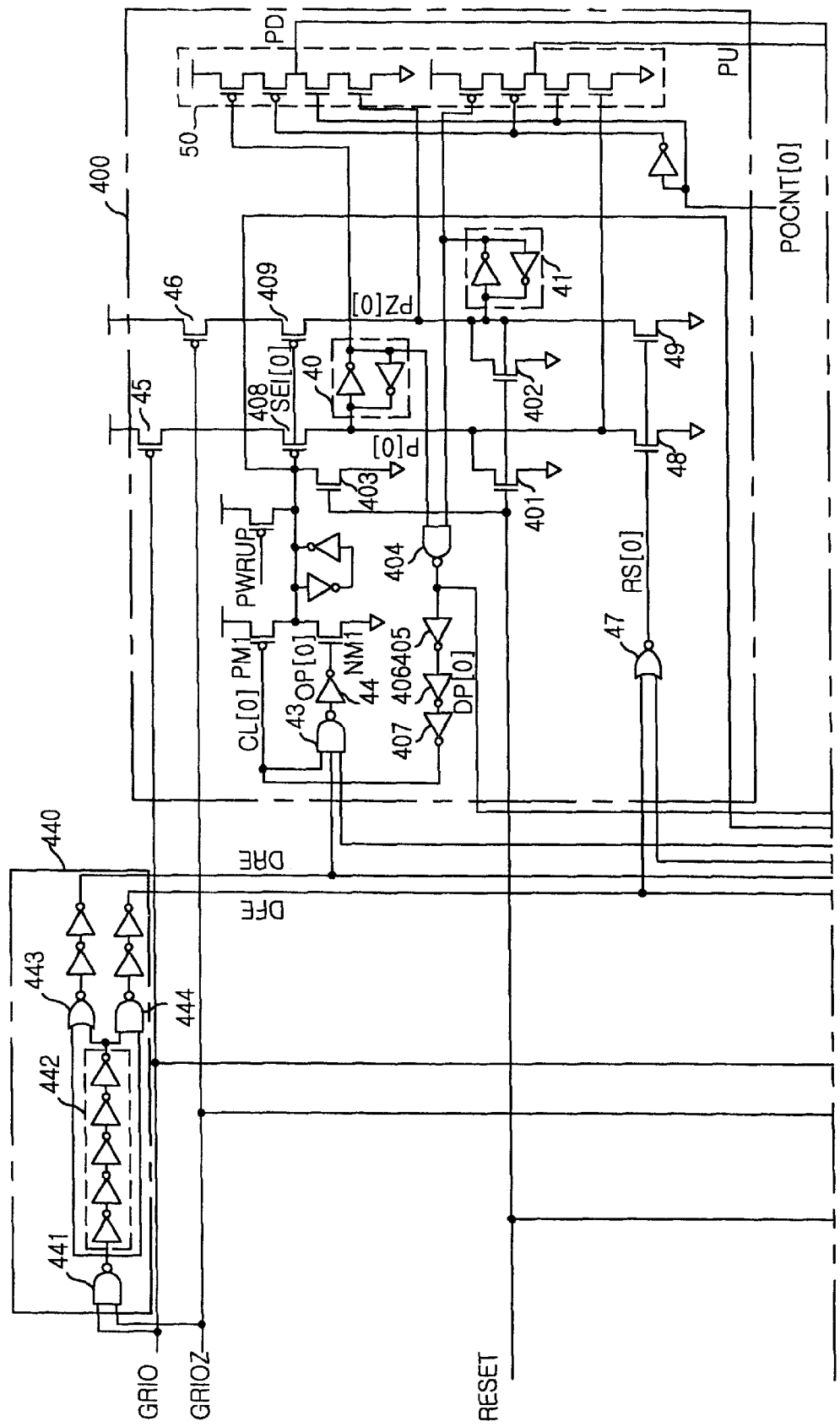
Figure 4B:
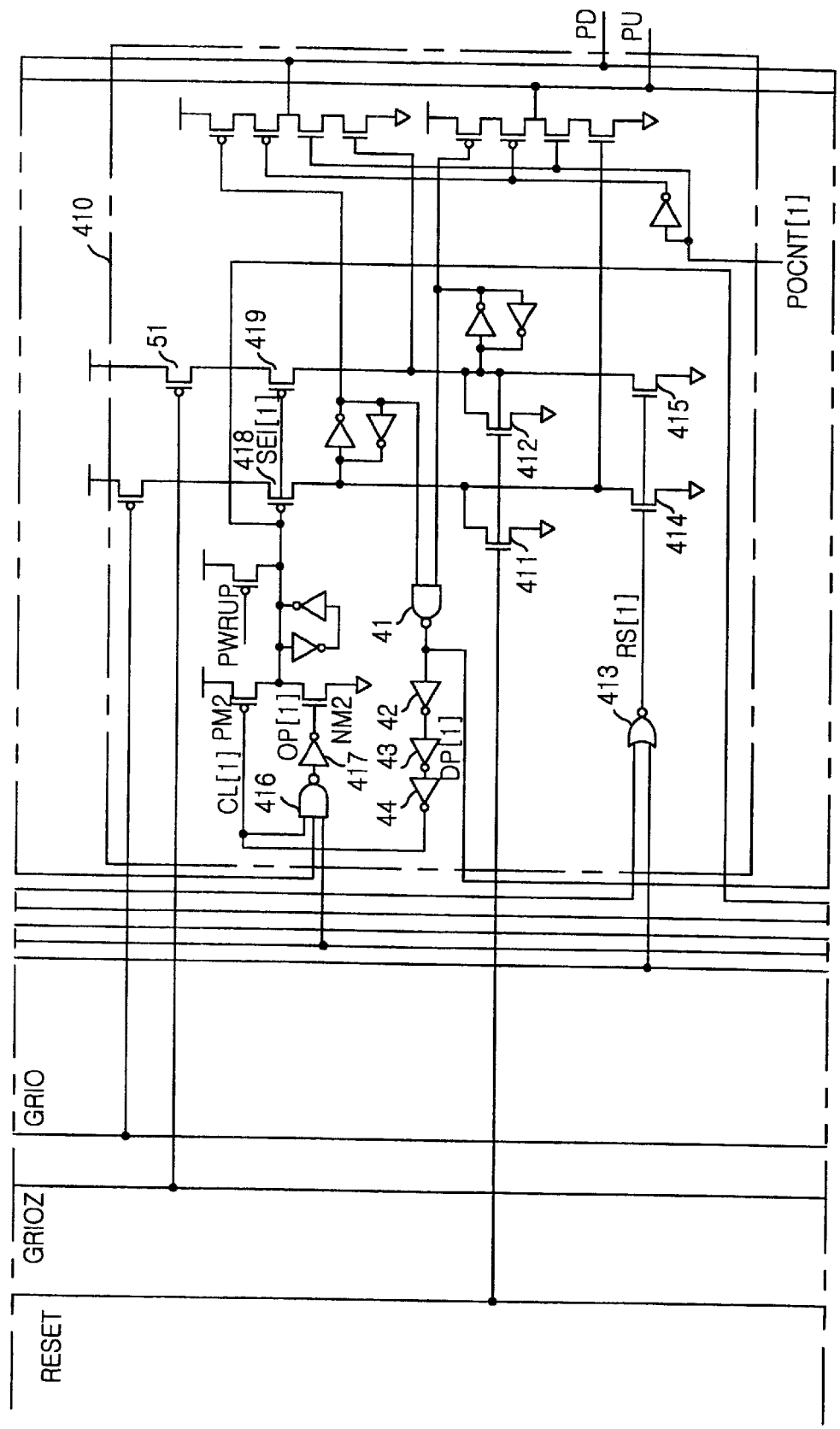
Figure 4C:
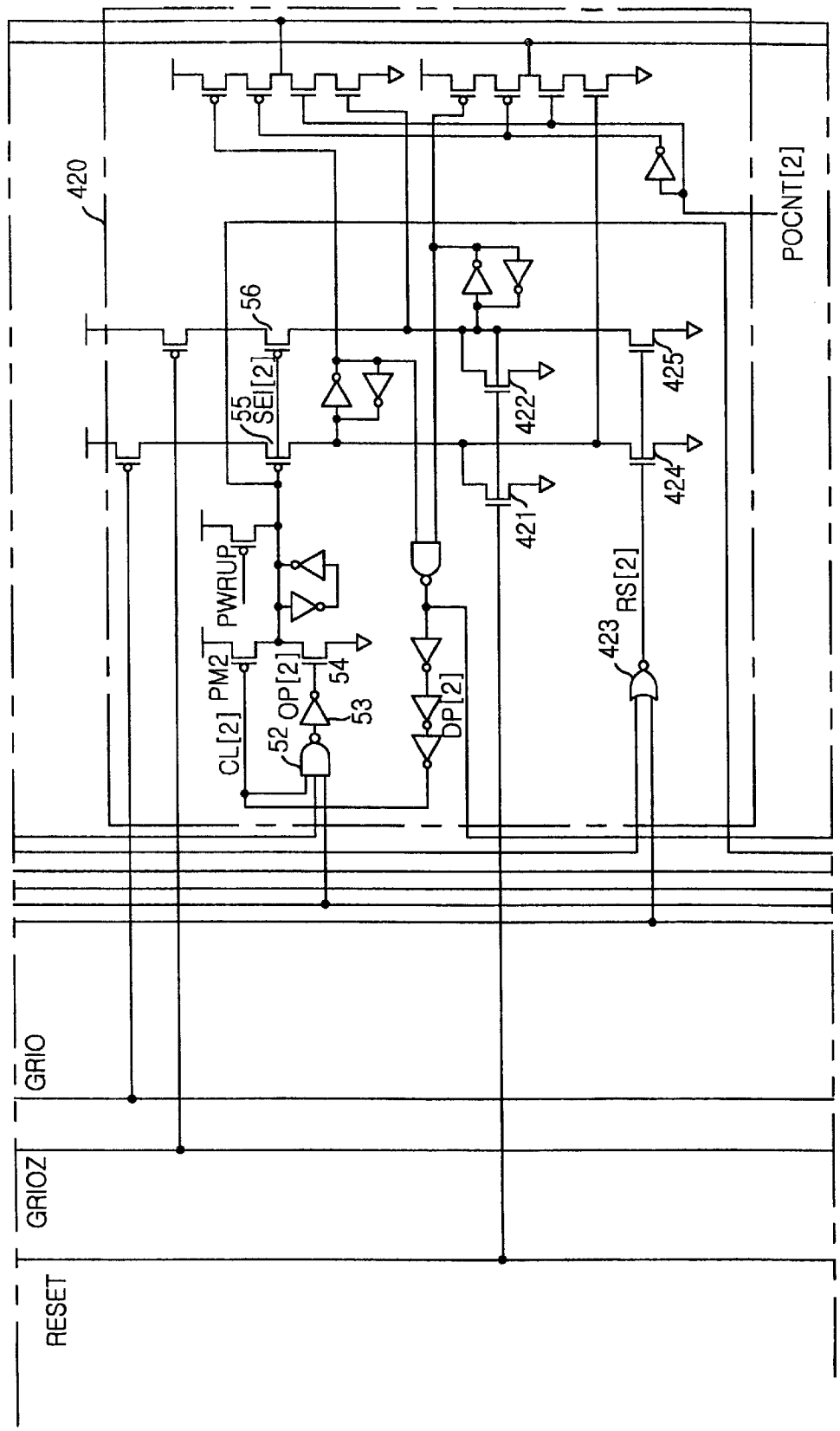
Figure 4D:
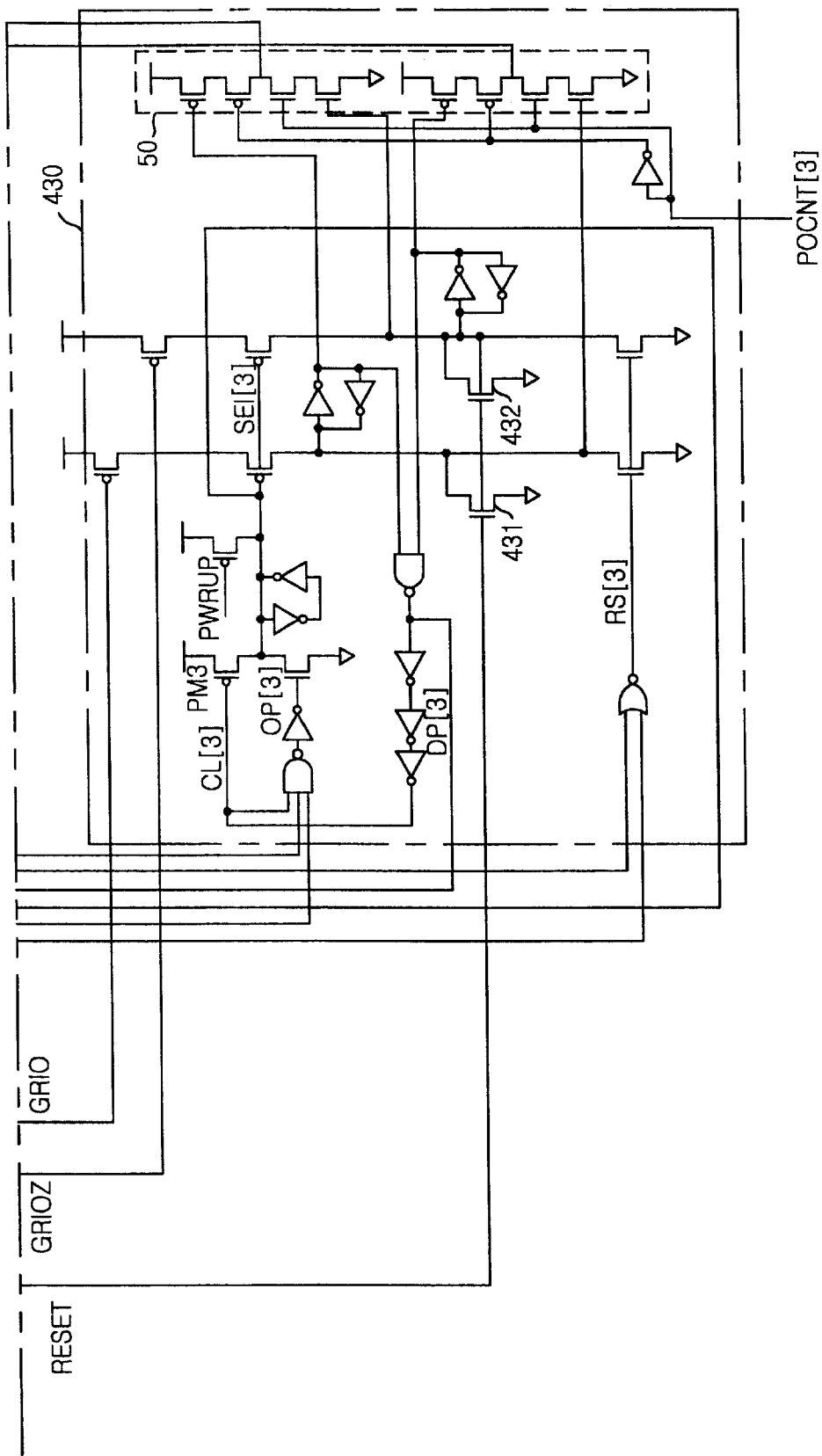
Figure 5A:
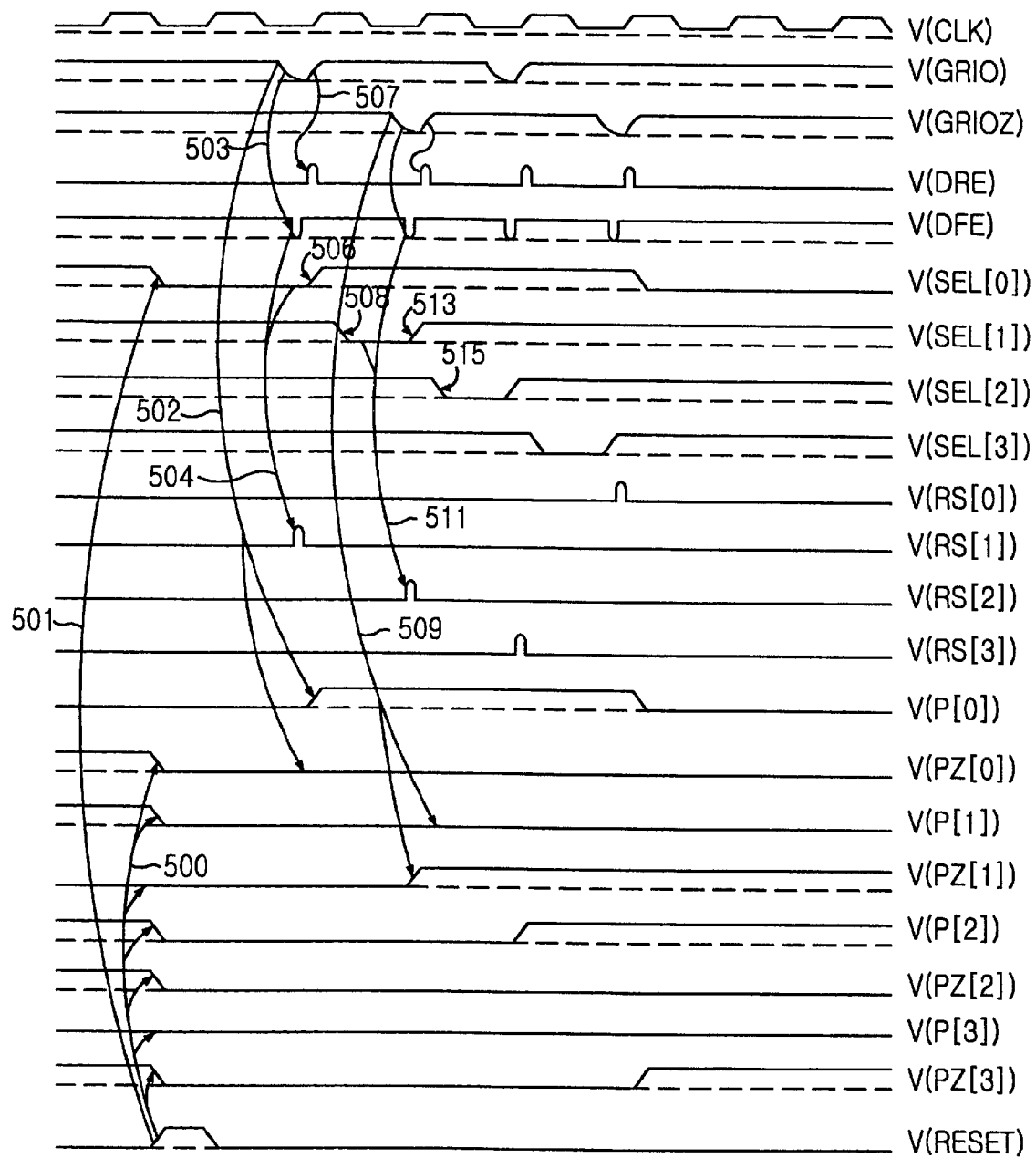
FIGS. 5A and 5B are timing charts of signals in a pipe-register shown in FIG. 4.
Figure 5B:
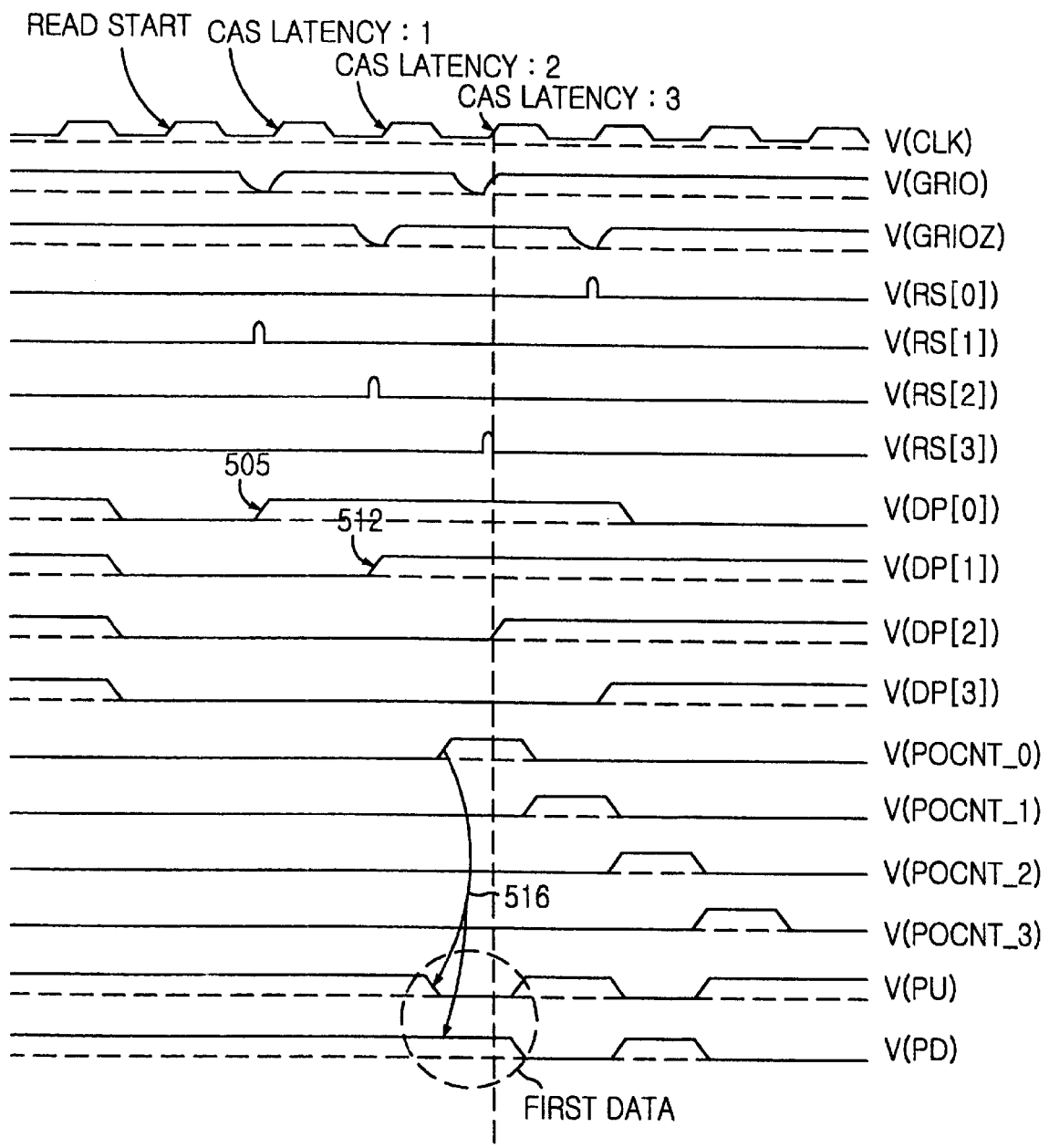

FIGS. 4 and 4A–4D are circuit diagrams illustrating a pipe register shown in FIG. 3. FIGS. 5A and 5B are timing charts of a pipe register in accordance with the present invention.

As shown, the pipe register according to the present invention includes four storage units 400, 410, 420 and 430 which are capable of supporting a column address strobe (CAS) latency maximally up to four clocks. The four storage units 400, 410, 420 and 430 are coupled to the global I/O lines GIO and the complementary global I/O lines GIOZ, so that a read data is transferred to the pipe register. At this time, the global I/O lines GIO and the complementary global I/O lines GIOZ are maintained at a precharged state of a high level, and data is loaded to the global I/O lines GIO and the complementary global I/O lines GIOZ in a state of a low level.

In addition, the pipe register in accordance with the present invention includes a data detector 440, coupled to the global I/O lines GIO and the complementary global I/O lines GIOZ. The data detector 440 detects whether or not the data is loaded on the global I/O lines GIO and the complementary global I/O liens GIOZ.

The data detector 440 includes a NAND gate 441, a delay unit 442, a NOR gate 443, and a NAND gate 444.

The NAND gate 441 has an input terminal coupled to the global I/O lines GIO and the complementary global I/O lines GIOZ. The NAND gate 441 detects whether or not data is loaded on the global I/O lines GIO and the complementary global I/O lines GIOZ.

The delay unit 442 is coupled to an output terminal of the NAND gate 441. The delay unit 412 inverts and delays an output signal of a NAND gate 441 for a predetermined time.

The NOR gate 443 detects falling edges of the data loaded on the global I/O lines GIO and the complementary global I/O lines GIOZ in response to an output signal from the NAND gate 441 and an output signal from the delay unit 442, to generate a detection falling edge (DFE) signal as a low active signal.

The NAND gate 444 detects rising edges of the data loaded on the global I/O lines GIO and the complementary global I/O lines GIOZ in response to the output signal of the NAND gate 441 and the delay unit 442, to generate a detection rising edge (DFE) signal.

The DRE and DFE signals outputted from the data detector 440 are transferred to the four storage units 400 to 430.

At this time, when a reset signal RESET is inputted to the four storage units 400 to 430 at an initial read operation, all the data stored in the storage units 400 to 430 are deleted and the selection signal SEL[0] of the first storage unit 400 is enabled to a low level.

A pipe counter signal PCONT[3:0]) is a signal for sequentially outputting the data stored in the storage units 400 to 430 to a data output buffer in synchronous with the clock cycle of a predetermined CAS latency.

Hereinafter, a structure of the storage units 400 to 430 will be described in detail.

The first storage unit 400 includes a first latch circuit 40 that is constituted with two inverters, a second latch circuit 41 for storing data into a storage node PZ[0]. A selection signal disabling unit detects data stored in the first latch circuit 40 and the second latch circuit 41 to generate a selection signal SEL[0] for disabling selection transistors 408 and 409.

A selection signal enabling unit outputs a selection signal SEL[0] for enabling the selection transistors 408 and 409 in response to a DRE signal, a control signal CL[0] and data stored in a previous storage unit 430.

PMOS transistors 45 and 46 are coupled between a power terminal and the selection transistors 408 and 409. Each gate of the PMOS transistors 45 and 46 is coupled to the global I/O line GIO and the complementary global I/O line GIOZ.

An initial reset unit clears data stored in the first latch circuit 40 and the second latch circuit 41 in response to a reset signal RESET at an initial operation mode and enables a selection signal SEL[0], so that the first latch circuit 40 and the second latch circuit 41 receives data loaded on the global I/O lines GIO and the complementary global I/O lines GIOZ.

A clear unit clears data loaded on the storage node P[0] and PZ[0] of the first latch circuit 40 and the second latch circuit 41 in response to the DFE signal and a selection signal SEL[3] of the storage unit 430.

An output driving unit 50A and 50B drives output signals PU and PD in response to the data stored in the first and the second latch circuits 40 and 41 and the pipe counter signal POCNT[0].

The selection transistors 408 and 409 are coupled between the PMOS transistors 45 and 46 and the storage units P[0] and PZ[0], respectively, and each gate receives the selection signal SEL[0].

The selection signal disabling unit includes a NAND gate 404 having an input terminal coupled to the first and the second latch circuit 40 and 41, an odd number of inverters 405 to 407 for inverting an output signal of the NAND gate 404 to output the control signal CL[0], a PMOS transistor PM1 for pulling up the selection signal SEL[0] in response to the control signal CL[0], whose one terminal is coupled to the power terminal and gate receives the control signal CL[0].

The selection enabling unit includes a NAND gate 43 for NANDing the control signal CL[0], the DRE signal and an output signal DP[3] of the fourth storage unit 430, an inverter 44 for inverting an output signal of the NAND gate 43, and an NMOS transistor NM1 for pulling up the selection signal SEL[0] in response to an output signal OP[0] of the inverter 44. The NMOS transistor NM1 is coupled between a drain of the PMOS transistor PM1 and a ground terminal, whose gate receives an output signal OP[0] of the inverter 44.

In the initial reset unit, an NMOS transistor 401 whose gate receives the reset signal RESET is coupled between the storage node P[0] and the ground terminal. An NMOS transistor 402 whose gate receives the reset signal RESET is coupled between the storage node PZ[0] and the ground terminal. An NMOS transistor 403 whose gate receives the reset signal RESET is coupled between a node of the selection signal SEL[0] and the ground terminal.

In the clear unit, the DFE signal and the selection signal SEL[3] are NORed by a NOR gate 47. An NMOS transistor 48 whose gate receives an output signal of the NOR gate 47 is coupled between the storage node P[0] and the ground terminal. An NMOS transistor 49 whose gate receives an output signal of the NOR gate 47 is coupled to the storage node PZ[0] and the ground terminal.

The output driving unit includes a first driving unit 50A for driving the output signal PU of the pipe register and a second driving unit 50B for driving the output signal PD of the pipe register.

The first driving unit 50A includes a PMOS transistor whose gate receiving an inverted signal of the storage node P[0], a PMOS transistor whose gate receives the inverted pipe counter signal POCNT[D], an NMOS transistor whose gate receives the pipe counter signal POCNT[0], and an NMOS transistor whose gate receives a signal of the storage node PZ[0]. At this time, the PMOS transistors and the NMOS transistors are serially coupled between the power terminal and the ground terminal.

The second driving unit 50B includes a PMOS transistor whose gate receives the inverted signal of the storage node PZ[0], a PMOS transistor whose gate receives the inverted pipe counter signal POCNT[0], an NMOS transistor whose gate receives the pipe counter signal POCNT[0], and an NMOS transistor whose gate receives a signal of the storage node P[0]. The PMOS transistors and the NMOS transistors are serially coupled between the power terminal and the ground terminal.

The storage units 410 to 430 have the same structure and operation as the first storage unit 400, except the NMOS transistor 403 contained in the initial reset unit.

The operation of the present invention will be described below in detail with reference to FIGS. 4, 5A and 5B.

First, it is assumed that the global I/O lines GIO and the complementary global I/O lines GIOZ are precharged in a state of a high level and the selection signal SEL[0], SEL[1], SEL[2] and SEL[3]) of the first to fourth storage units 400 to 430 are maintained in a state of a high level.

If the read operation is initiated (500, in FIG. 5A), the reset signal RESET of a high level is applied to the pipe register. The NMOS transistors 401, 411, 421 and 431 are turned on in response to the reset signal RESET, so that the storage nodes P[0], P[1], P[2] and P[3] of the first to fourth storage units 400 to 430 are reset to a low level. In similar manner, the NMOS transistors 402, 412, 422 and 432 are turned on in response to the reset signal RESET of a high level, so that the storage nodes PZ[0], PZ[1], PZ[2] and PZ[3] of the first to fourth storage units 400 to 430 are reset to a low level (500, in FIG. 5A).

Next, the NMOS transistor 403 contained in the first storage unit 400 is turned on in response to the reset signal RESET of a high level and the selection signal SEL[0] of the first storage unit 400 is changed to a low level due to the turned-on NMOS transistor 403, so that the first storage unit 400 is enabled (501, in FIG. 5A).

Next, in case where the data read out from a memory cell is loaded to the global I/O line GIO and the complementary global I/O line GIOZ, a level of the global I/O line GIO is changed to a low level and a level of the complementary global I/O line GIOZ is maintained at a high level. Then, the PMOS transistor 45 is turned on, so that a high level is latched in the storage node P[0] of the first storage unit 400 enabled in response to the selection signal SEL[0] and the storage node PZ[0] is maintained at a low level (502, in FIG. 5A) Simultaneously, the data detector 440 senses the data loaded on the global I/O line GIO and the complementary global I/O line GIOZ to generate the DFE signal of a low level (503, in FIG. 503).

Next, the NOR gate 413 receives the DFE signal of a low level and the selection signal SEL[0] of a low level to generate a signal RS[1] of a high level (504, in FIG. 5), and the NMOS transistor 414 and 415 is turned on in response to the signal RS[1] of a high level therefore, the storage nodes P[0] and PZ[1] of the second storage unit 410 is cleared to a state of a low level. That is, the NOR gate 413 clears the data stored in the second storage unit 410 in response to the DFE signal and the selection signal SEL[0].

Next, the NAND gate 404 receives the high level signal of the storage node P[0] and the low level signal of the storage node PZ[0], to generate the signal DP[0] of a high level (505, in FIG. 5B) and the control signal CL[0] of a low level. Then, the PMOS transistor PM1 is turned on in response to the control signal CL[0] of a low level, and the selection signal SEL[0] of the first storage unit 400 is changed to a high level (506, in FIG. 5A), so that the PMOS transistors 408 and 409 are turned off. That is, the NAND gate 40 and three inverters 405 to 407 detects a completion of the storing operation with respect to the first storage unit 400 and disables the first storage unit 400. Therefore, the storage node P[0] and the storage node PZ[0] are maintained at a high level and a low level, respectively, until they are cleared.

Next, when a level of the global I/O line GIO is changed to a high level, the data detector 404 senses the level transition of the global I/O line GIO to generate the DRE signal of a high level (507, in FIG. 5A).

The DRE signal of a high level, the signals DP[0] of a high level and the control signal CL[1] of a high level are NANDed through the NAND gate 416 and an output signal of the NAND gate 416 is inverted through an inverter 417. As a result, a signal OP[0] of a high level is outputted through the inverter 417.

The NMOS transistor NM42 is turned on in response to the signal OP[0] of a high level, so that the selection signal SEL[1] of the second storage unit 410 is driven to a low level (508, in FIG. 5A). Accordingly, the PMOS transistors 418 and 419 are turned on, and therefore, it is ready to store a second data into the global I/O line GIO and the complementary global I/O line GIOZ.

Next, when the second data is loaded into the global I/O line GIO and the complementary global I/O line GIOZ, that is, the global I/O line GIO is maintained at a high level and the complementary global I/O line GIOZ is changed to a low level, the PMOS transistor 51 is turned on. Then, a high level is latched to the storage node PZ[1] of the second storage unit 410 enabled in response to the selection signal SEL[1] (509, in FIG. 5A) and the data detector 440 simultaneously generates the DFE signal of a low level (510, in FIG. 5A).

The NOR gate 423 receives the DFE signal of a low level and the selection signal SEL[1] of a low level to generate a signal RS[2] of a high level (511, in FIG. 5), and the NMOS transistor 424 and 425 is turned on in response to the signal RS[2] of a high level. Therefore, the storage nodes P[2] and PZ[2] of the third storage unit 420 is cleared to a state of a low level. That is, the NOR gate 423 clears the data stored in the third storage unit 420 in response to the DFE signal and the selection signal SEL[1].

Next, the NAND gate 414 receives the high level signal of the storage node PZ[1] and the low level signal of the storage node P[1], to generate the signal DP[1] of a high level (515, in FIG. 5B) and the control signal CL[1] of a low level. Then, the PMOS transistor PM2 is turned on in response to the control signal CL[1] of a low level, and the selection signal SEL[1] of the second storage unit 410 is changed to a high level (5136, in FIG. 5A), so that the PMOS transistors 418 and 419 are turned off. That is, the NAND gate 41 and three inverters 42, 43 and 44 detects a completion of the storing operation with respect to the second storage unit 410 and disables the second storage unit 410. Therefore, the storage node PZ[1] and the storage node P[1] are maintained at a high level and a low level, respectively, until they are cleared.

Next, when a level of the complementary global I/O line GIOZ is changed to a high level, the data detector 404 senses the level transition of the complementary global I/O line GIOZ to generate the DRE signal of a high level (501, in FIG. 5A).

The DRE signal of a high level, the signal DP[1] of a high level and the control signal CL[2] of a high level are NANDed through the NAND gate 52 and an output signal of the NAND gate 52 is inverted through an inverter 53. As a result, a signal OP[2] of a high level is outputted through the inverter 53.

The NMOS transistor 54 is turned on in response to the signal OP[2] of a high level, so that the selection signal SEL[2] of the third storage unit 420 is driven to a low level (515, in FIG. 5A). Accordingly, the PMOS transistors 55 and 53 are turned on, and therefore, it is ready to store a third data into the global I/O line GIO and the complementary global I/O line GIOZ.

In the same manner as the first and second data, in case where a third data and a fourth data are continuously loaded on the global I/O lines GIO and the complementary global I/O lines GIOZ, the third and the fourth data are stored into the third and fourth storage units, respectively.

In case where the CAS latency is of 3, the pipe counter signal POCNT[0] is changed to a high level and a stored data is outputted to the data output buffer through the output driving unit 50a and 50B contained in the first storage unit 400. That is, in response to a high level signal of the storage node P[0] and a low level signal of the storage node PZ[0], the output signal PU of a high level and the output signal PD of a low level is transferred to the data output buffer (516, in FIG. 5B), and then the data loaded on the global I/O line GIO and the complementary global I/O line GIOZ are stored into the third storage unit 420.

Next, at a next clock, the pipe counter signal POCNT[0] is changed to a low level, so that the output driving unit 50A and 50B of the first storage unit 400 is disabled. At the same time, the pipe counter signal POCNT[1] from the pipe counter is changed to a high level, so that data stored in the second storage unit 410 is transferred to the data output buffer through the output driving unit 51A and 51B of the second storage unit 410. Sequentially, the data loaded on the global I/O line GIO and the complementary global I/O line GIOZ are stored into the fourth storage unit 430.

Next, at a next clock, the pipe counter signal POCNT[1] is changed to a low level, so that the output driving unit 51A and 51B of the second storage unit 410 is disabled. At the same time, the pipe counter signal POCNT[2] from the pipe counter is changed to a high level, so that data stored in the third storage unit 420 is transferred to the data output buffer through the output 52A and 52B of the third storage unit 420. Sequentially, the data loaded on the global I/O line GIO and the complementary global I/O line GIOZ are stored again into the first storage unit 400.

As described above, according to the change of the cycle, the data stored in the storage unit is outputted to the data output buffer in response to the pipe counter signal and the data are alternatively stored into the storage units in response to the CAS latency.

Consequently, by constituting the pipe register having four storage units, if the data is loaded on the global I/O line and the complementary global I/O line, the loaded data is sensed and stored into one of the four storage units. Simultaneously, a next storage unit is cleared in response to the CAS latency, so that a next data is stored into the next storage unit.

While the present invention has been described with respect to the particular embodiments, it will be apparent to those skilled in the art that various changes and modifications may be made without departing from the scope of the invention as defined in the following claims.

What is claimed is:

1. A semiconductor memory device for outputting data at a high speed, comprising:

global input/output (I/O) lines;

complementary global I/O lines; and pipe registers, coupled to said global I/O lines and said complementary global I/O lines, for detecting the data loaded on said global I/O lines and said complementary global I/O lines to store the data, said pipe register comprising:

a data detecting means, coupled to said global I/O lines and complementary global I/O lines, for detecting whether the data is loaded on said global I/O lines and complementary global I/O lines;

a control signal generating means for sensing edges of the data loaded on the global I/O line and the complementary global I/O line to generate a rising edge sensing signal and a falling edge sensing signal; and a plurality of storage means for storing the data loaded on said global I/O lines and said complementary global I/O lines in response to a reset signal, the falling edge sensing signal and the rising edge sensing signal and for outputting the data in response to the pipe counter signal outputted from said pipe counting means.

2. The semiconductor memory device as recited in claim 1, further comprising:

a pipe counting means for generating a pipe counter signal to control an output sequence of the data stored in said pipe registers, wherein each of said pipe registers outputs the data in response to the pipe count signal.

3. A pipe register for use in a semiconductor memory device, wherein said semiconductor memory device includes global input/output (I/O) lines, complementary global I/O lines, and pipe registers, coupled to said global I/O lines and said complementary global I/O lines, for detecting the data loaded on said global I/O lines and complementary global I/O lines to store the data, said pipe register comprising:

a data detecting means, coupled to said global I/O lines and complementary global I/O lines, for detecting whether the data is loaded on said global I/O lines and complementary global I/O lines;

a control signal generating means for sensing edges of the data loaded on the global I/O line and the complementary global I/O line to generate a rising edge sensing signal and a falling edge sensing signal; and a plurality of storage means for storing the data loaded on said global I/O lines and said complementary global I/O lines in response to a reset signal, the falling edge sensing signal and the rising edge sensing signal and for outputting the data in response to the pipe counter signal outputted from said pipe counting means.

4. The pipe register as recited in claim 3, wherein each of storage means includes:

a first latch circuit for storing the data loaded on said global I/O lines in response to a select signal;

a second latch circuit for storing the data loaded on said complementary global I/O lines in response to the select signal;

a reset circuit for resetting the data by pulling down the data stored in said first and second latch circuits;

a select signal generation circuit coupled to said first and second latch circuits for generating the select signal in response to the rising edge sensing signal and a first control signal;

a clear circuit for clearing the data stored in said first and second latch circuits in response to the falling edge sensing signal and the select signal; and a drive circuit for driving an output signal in response to the data stored in said first and second latch circuits and the pipe count signal outputted from said pipe counting means.

5. The pipe register as recited in claim 4, wherein said first latch circuit includes:

a pull-up means for pulling up a first storage node in response to the data loaded on said global I/O lines and the select signal; and a data storage means coupled to the first storage node.

6. The pipe register as recited in claim 5, wherein said pull-up means includes:

a first PMOS transistor coupled between a power terminal and the first storage node, wherein said first PMOS transistor has a gate terminal coupled to one of said global I/O lines and complementary global I/O lines; and a second PMOS transistor for receiving the select signal.

7. The pipe register as recited in claim 5, wherein said data storage means includes:

a first inverter having an input terminal coupled to the first storage node; and a second inverter having an input terminal coupled to an output terminal of the first inverter and an output terminal coupled to the input terminal of the first inverter.

8. The pipe register as recited in claim 4, wherein said second latch circuit includes:

a pull-up means for pulling up a second storage node in response to the data loaded on said complementary global I/O lines and the select signal; and a data storage means coupled to the second storage node.

9. The pipe register as recited in claim 8, wherein said pull-up means includes:

a first PMOS transistor coupled between a power terminal and the second storage node, wherein said first PMOS transistor has a gate terminal coupled to one of said global I/O lines and said complementary global I/O lines; and a second PMOS transistor for receiving the select signal.

10. The pipe register as recited in claim 9, wherein said data storage means includes:

a first inverter having an input terminal coupled to the first storage node; and a second inverter having an input terminal coupled to an output terminal of the first inverter and an output terminal coupled to the input terminal of the first inverter.

11. The pipe register as recited in claim 4, wherein said reset circuit includes:

a first pull-down transistor, coupled between a first storage node of said first latch circuit and a ground terminal, for receiving the reset signal; and a second pull-down transistor, coupled between a second storage node of said second latch circuit and the ground terminal, for receiving the reset signal.

12. The pipe register as recited in claim 4, wherein said select signal generation circuit includes:

a first select signal generation circuit, coupled to a first storage node of said first latch circuit and a second storage node of said second latch circuit, for generating the select signal disabled by detecting whether the data has been stored in said first and second storage nodes; and a second select signal generation circuit for generating the select signal enabled in response to the rising edge sensing signal, the first control signal and a second control signal.

13. The pipe register as recited in claim 12, wherein said first select signal generation circuit includes:

a NAND gate, coupled to said first storage node and said second storage node, for carrying out a logical NAND operation;

inverters for inverting an output signal of said NAND gate to output said second control signal; and a pull-up transistor, coupled between the supply voltage and an output terminal outputting the select signal, for pulling up the select signal in response to the second control signal.

14. The pipe register as recited in claim 12, wherein said second select signal generation circuit includes:

a NAND gate for NANDing the rising edge sensing signal, the first control signal and the second control signal; and a pull-down transistor, coupled between an output terminal outputting the select signal and the ground terminal, for pulling down the select signal in response to an output signal outputted from said NAND gate.

15. The pipe register as recited in claim 12, wherein said select signal generation circuit includes:

a third select signal generation circuit for enabling the select signal in response to the reset signal.

16. The pipe register as recited in claim 15, wherein said third select signal generation circuit includes:

a pull-down transistor for pulling down the select signal in response to the reset signal.

17. The pipe register as recited in claim 4, wherein said clear circuit includes:

a NAND gate for carrying out a logical NAND operation in response to said falling edge sensing signal and the select signal;

a first pull-down transistor, coupled between the first storage node of said first latch circuit and a ground terminal, for pulling down the first storage node in response to an output signal outputted from said NAND gate; and a second pull-down transistor, coupled between the second storage node of said second latch circuit and the ground terminal, for pulling down the second storage node in response to an output signal outputted from said NAND gate.

* * * * *